United States Patent
Serebryanov et al.

(10) Patent No.: US 7,933,009 B2
(45) Date of Patent: Apr. 26, 2011

(54) METHOD AND APPARATUS FOR VERIFYING PROPER SUBSTRATE POSITIONING

(75) Inventors: Oleg Serebryanov, San Jose, CA (US);
Alexander Lerner, San Jose, CA (US);
Aaron Hunter, Santa Cruz, CA (US);
Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 626 days.

(21) Appl. No.: 11/829,748

(22) Filed: Jul. 27, 2007

(65) Prior Publication Data
US 2009/0027657 A1 Jan. 29, 2009

(51) Int. Cl.
*G01J 1/00* (2006.01)
*G01B 11/14* (2006.01)
(52) U.S. Cl. ........................... 356/213; 356/614
(58) Field of Classification Search .......... 356/218–222
See application file for complete search history.

(56) References Cited

U.S. PATENT DOCUMENTS
| | | | | |
|---|---|---|---|---|
| 5,844,683 A * | 12/1998 | Pavloski et al. | ............... | 356/399 |
| 5,980,194 A | 11/1999 | Freerks et al. | | |
| 6,231,716 B1 * | 5/2001 | White et al. | ............. | 156/345.54 |
| 6,471,464 B1 | 10/2002 | Fay et al. | | |
| 7,012,672 B2 * | 3/2006 | Van Rhee et al. | ............... | 355/53 |

FOREIGN PATENT DOCUMENTS
JP 61-170605 A 8/1986
JP 08-203819 8/1996

OTHER PUBLICATIONS
International Search Report and Written Opinion mailed Oct. 6, 2008 for PCT Application No. PCT/US08/70486.

* cited by examiner

*Primary Examiner* — Michael P Stafira
(74) *Attorney, Agent, or Firm* — Moser IP Law Group

(57) ABSTRACT

Embodiments of methods and apparatus for detecting the proper position of a substrate in a chamber are provided herein. In some embodiments, a substrate position detection apparatus includes a substrate support having a plurality of lift pins for supporting a substrate in an elevated position thereover; a light source for directing a beam of light upon a reflective upper surface of the substrate; and a light sensor for detecting a reflected beam of light from the upper surface of the substrate upon the substrate being aligned in a predetermined elevated position.

21 Claims, 4 Drawing Sheets

METHOD AND APPARATUS FOR VERIFYING PROPER SUBSTRATE POSITIONING

BACKGROUND OF THE INVENTION

1. Field of the Invention

Embodiments of the present invention generally relate to methods and apparatus for semiconductor device fabrication, and more specifically, to methods and apparatus for detecting proper positioning of semiconductor substrates.

2. Description of the Related Art

Each manufacturing step performed on a semiconductor or flat panel display substrate incrementally increases its value to the associated manufacturer. At any given time, a manufacturer may have in its inventory hundreds, or even thousands of in-process substrates. During the device manufacturing process, a given substrate may be moved, placed, and retrieved dozens of times or more between and among different processing and storage locations within the fabrication facility. For the most part, such movement, placement, and retrieval of in-process substrates within the fabrication facility occurs automatically, and/or without direct operator intervention or supervision, thereby reducing the potential for damage to valuable in-process inventory due to operator error.

However, a risk of damage to in-process substrates still exists, despite the implementation of automated substrate handling technology. For example, even if a substrate has been successfully delivered to the general vicinity of a particular substrate support element (e.g., to a substrate support platform, a transfer surface, an end effector, a set of support pins, or the like), the substrate may fail to assume an expected position or spatial orientation relative to the support element (e.g., upon initial placement thereon), or fail to remain in such expected position or spatial orientation. Such improper positioning and/or spatial orientation, if not timely corrected or otherwise compensated for, can quickly lead to substrate damage, e.g., via a subsequent device formation step that proceeds improperly due to a gross error in substrate positioning or orientation, or via an unintended collision between the substrate and an automated end effector during a subsequent substrate transfer step. Moreover, damage to equipment or contamination of subsequent or proximate substrates may further occur.

Thus, there is a need for effective methods and apparatus for reducing the risk of substrate and/or equipment damage arising from improper substrate positioning and/or spatial orientation relative to associated support elements.

SUMMARY OF THE INVENTION

Embodiments of methods and apparatus for detecting the proper position of a substrate in a chamber are provided herein. In some embodiments, a substrate position detection apparatus includes a substrate support having a plurality of lift pins for supporting a substrate in an elevated position thereover; a light source for directing a beam of light upon a reflective upper surface of the substrate; and a light sensor for detecting a reflected beam of light from the upper surface of the substrate upon the substrate being aligned in a predetermined elevated position.

In some aspects of the invention, methods for detecting the proper position of a substrate in a chamber are provided herein. In some embodiments, a method of detecting the position of a substrate includes elevating a substrate relative to a support; and verifying the proper position of the substrate relative to the support by: shining a beam of light upon a reflective surface of the substrate; and monitoring for a reflected beam of light off of the reflective surface indicative of the reflective surface being aligned in a predetermined elevated position.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images in the drawings are simplified for illustrative purposes and are not depicted to scale.

DETAILED DESCRIPTION

Embodiments of the present invention provide methods and apparatus for determining and/or verifying proper substrate positioning. The methods and apparatus may be utilized to advantageously mitigate substrate and/or equipment damage due to improper substrate positioning. Such improper substrate positioning may be due to, for example, broken, damaged, or otherwise improperly functioning equipment (e.g., lift pins or the like), broken substrates, or the like.

Figure 1:
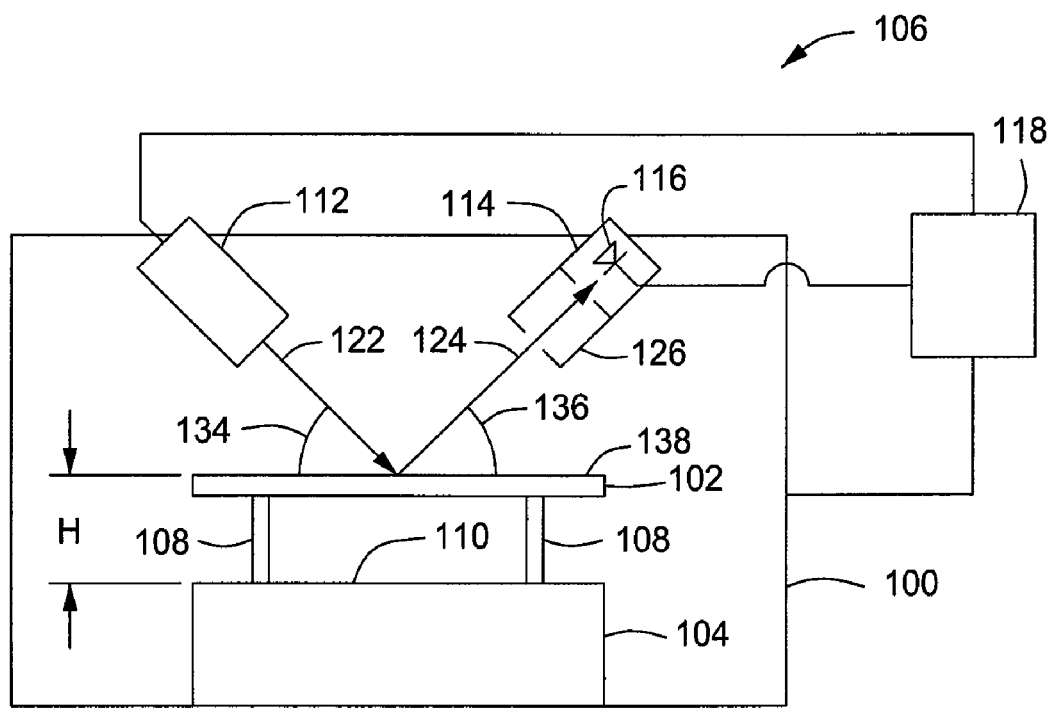
FIG. 1 depicts an exemplary schematic diagram of a process chamber having an apparatus for detecting a substrate position according to some embodiments of the present invention.

FIG. 1 is a schematic illustration of a chamber 100 for receiving and retaining a substrate 102. The chamber 100 can be any conventional chamber used in a semiconductor device fabrication facility, e.g., a substrate processing chamber, a substrate storage chamber, a metrology chamber, a substrate transfer chamber, or the like.

The chamber 100 generally includes a substrate support 104 and a substrate position detection system 106. The substrate support 104 may be any suitable support having a support surface 110 sized and shaped for receiving and supporting the substrate 102 thereupon.

The substrate support 104 further includes a set of lift pins 108 for positioning the substrate 102 relative to the substrate support 104. Typically, at least three (3) or more lift pins 108 are provided. The lift pins 108 are collectively movable relative to the substrate support 104 and may be configured for moving the substrate 102 in two or more positions within the chamber 100. For example, the lift pins 108 typically have at least an elevated position (as shown in FIG. 1) for holding the substrate 102 in a position suitable for transfer of the substrate 102 (e.g., at a predetermined height, H) via a blade of a substrate transfer robot (not shown), and a retracted position wherein the lift pins 108 retract downward into the substrate support 104 to permit the substrate 102 to rest on the substrate support surface 110. Optionally, the lift pins 108 may further have one or more intermediate positions for elevating the substrate 102 above the support surface 110 a pre-determined distance suitable for a particular process that is to be performed on the substrate 102. Alternatively, the lift pins may be stationary and the robot blade moved downward after releasing its grip on the substrate to allow the substrate to be supported only by the lift pins.

The substrate position detection system 106 is typically configured to detect the substrate 102 in one or more predetermined positions and/or to control and/or assist in the control of one or more operations with respect to the chamber 100. More particularly, and as discussed more fully below, in or under circumstances in which a substrate (e.g., the substrate 102) would be expected to occupy a predetermined position within the chamber 102, the system 106 can be selectively employed to detect or verify an expected presence of a substrate occupying the predetermined position within the chamber 100, and/or to determine an unexpected absence of the substrate from the predetermined position (e.g., indicating an error with respect to the position of such substrate).

For example, upon the system 106 detecting or verifying an expected presence of a substrate in the predetermined position, the substrate may be retrieved from the chamber 100, e.g., by a substrate-transfer robot (not shown) or the like. In such circumstances, the substrate retrieval can be a preplanned step of an automated substrate handling operation. In addition, upon the system 106 determining an unexpected absence of the substrate from the predetermined position, a preplanned retrieval of the substrate from the chamber 100 may be interrupted, suspended, canceled and/or otherwise altered (e.g., until such time as a visual inspection and/or corrective measure enables such a retrieval to be performed safely, and/or without undue risk of damage to the substrate and/or equipment).

The system 106 generally includes a light source 112 and a light sensor 114. The light source 112 may comprise any suitable light source for providing a focused beam of light that may be directed towards and may reflect off of an upper surface of a substrate disposed within the process chamber 100. In some embodiments, the light source may comprise a laser, one or more light-emitting diodes (LED), or the like. For example, FIG. 1 illustratively depicts a beam of light 122 emanating from the light source 112 and impinging upon an upper surface 120 of the substrate 102. It is contemplated that the light source 112 may comprise other components (e.g., light producing elements, light collimating elements, mirrors, or the like) that may be capable of forming and directing a beam of light (such as beam of light 122) as described herein.

The light sensor 114 may comprise any suitable sensor for detecting the presence of a beam of light, such as a photodiode 116, or the like. The light sensor 114 provides a signal indicative of one or more of the presence or absence of reflected light from the light beam shined by the light source 112. For example, as illustratively shown in FIG. 1, the beam of light 122 may reflect off of the upper surface 120 of the substrate 102 (as indicated by reflected beam of light 124) and impinge upon the photodiode 116.

In some embodiments, the light sensor 114 may include a shade 126 for defining a direction relative to the light sensor 114 along which light is permitted to pass for purposes of impinging upon the activating element of the light sensor 114 (e.g., the photodiode 116). The shade 126 may be configured to permit a substantially narrow range of angles for light to reach the activating element of the light sensor (such as a substantially singular angle or direction). The shade 126 may be further be configured to provide a lateral tolerance with respect to such a substantially narrow range of angles for light reaching the activating element of the light sensor to correspond to proper planar orientation of the substrate 102 but within an acceptable deviation in the vertical position of the substrate 102 with respect to the system 106. Alternatively, the shade 126 may be configured to permit a wider range of angles for light to reach the activating element of the light sensor to correspond to acceptable deviations in the planar and/or vertical position of the substrate 102 with respect to the system 106.

The light source 112 and the light sensor 114 may be attached to the chamber 100 in any conventional manner and may be disposed within the process chamber 100, at least partially disposed within a sidewall, ceiling, or other structure of the process chamber 100, or disposed externally to the process chamber 100 (in which case a window or other optically transparent feature may be provided to facilitate operation of the system 106 as described herein). The light source 112 and the light sensor 114 may be disposed in a fixed angular orientation with respect to each other to facilitate the detection by the light sensor 114 of a beam of light provided by the light source 112 when the substrate 102 is in a predetermined position (e.g., x, y, or z position, angular orientation with respect to a reference plane, or the like).

For example, in the embodiment illustratively depicted in FIG. 1, the light source 112 is configured to direct a beam of light at a fixed angle 134 relative to a horizontal reference plane (e.g., illustratively shown with respect to a horizontal elevated upper surface of the substrate 102) and the light sensor 114 is configured to receive a reflected beam of light having an angle of 136 relative to the horizontal reference plane, thereby facilitating interception of the reflected beam of light 124 when the substrate 102 is elevated to the height H by the lift pins 108 and is horizontally disposed upon the lift pins 108. Furthermore, the fixed orientation between the light source 112 and the light sensor 114 facilitates detection of a condition where the substrate 102 is not properly positioned (e.g., not at the predetermined height H, not horizontally aligned, or the like). Although illustratively described herein with respect to a horizontal reference plane, it is contemplated that the system 106 may be configured to detect the desired position of a substrate in systems having non-horizontal reference planes.

A processor 118 may be coupled to the system 106 via at least the light sensor 114. The processor 118 may include one or more microprocessors known in the art and may be separate from or part of a controller (not shown) coupled to the process chamber 100 for controlling the operation thereof. The processor generally controls operation of the system 106 and/or controls operation of the process chamber 100 (or components operable with the process chamber 100, such as a substrate transfer robot). For example, the processor 118 may be coupled to the light sensor 114 and may receive a signal therefrom indicative of the presence or absence of the substrate 102 in a predetermined position. In some embodiments, the light sensor 114 may generate and transmit a signal to the processor 118 and/or can cause such a signal being generated and transmitted. For example, light impinging upon the photodiode 116 may cause a signal to be generated and transmitted to the processor 118. It is contemplated that activation of the light sensor may alternatively result in the interruption of a signal being sent to the processor 118.

In some embodiments, the processor 118 may further be coupled to the light source 112 for selectively providing the beam of light 122. Alternatively, the beam of light may be continuously provided or have an activation controlled via another mechanism.

The processor 118 may be configured to directly or indirectly control the process chamber 100, components coupled to the process chamber 100 (such as a substrate transfer robot), and/or an entire processing system (such as a cluster tool) of which the process chamber 100 is itself a component. For example, the processor 118 may generate a signal indicating a fault or a no-fault condition based upon receipt of the signal from the light sensor 114. The processor 118 may route that signal to a display, other controllers, or the like, and/or may directly interrupt a process routine (such as a pending substrate transfer) based upon the receipt, or lack or receipt, of the signal from the light sensor 114.

Figure 4:
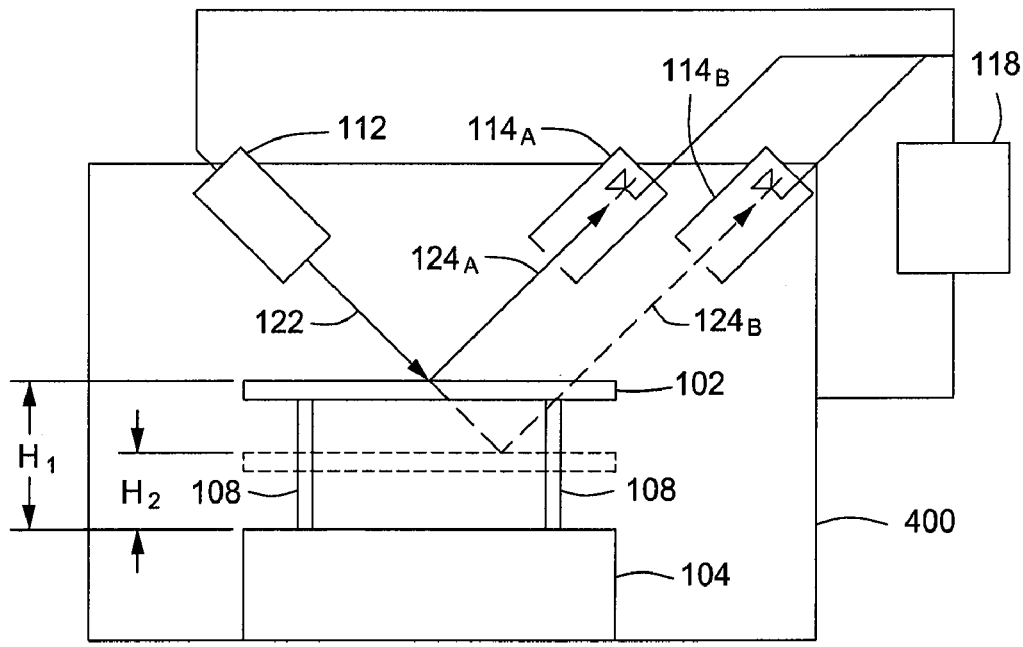
FIG. 4 depicts an exemplary schematic diagram of a process chamber having an apparatus for detecting a substrate position according to some embodiments of the present invention.

It is contemplated that multiple light sources 112 and/or light sensors 114 may be provided as described herein to detect proper substrate alignment with respect to multiple processing planes within a process chamber. For example, FIG. 4 depicts a schematic diagram of a process chamber 400 generally similar to the process chamber 100 described above. The process chamber 400 has a substrate support 104 and lift pins 108 that may selectively position the substrate 102 in at least two elevated positions above the substrate support 104: a first position having a height $H_1$ between the upper surface of the substrate 102 and the support surface of the substrate support 104, and a second position having a height $H_2$ between the upper surface of the substrate 102 and the support surface of the substrate support 104. As shown in FIG. 4, the process chamber 400 may have a first light sensor 114$_A$ configured to detect the reflected beam of light 124$_A$ when the substrate is elevated and properly aligned at height $H_1$. The process chamber 400 further has a second light sensor 114$_B$ configured to detect the reflected beam of light 124$_B$ when the substrate is elevated and properly aligned at height $H_2$. It is contemplated that the substrate position in multiple processing planes may similarly be monitored via the use of multiple light sources 112 and one or more light sensors 114.

Figure 5:
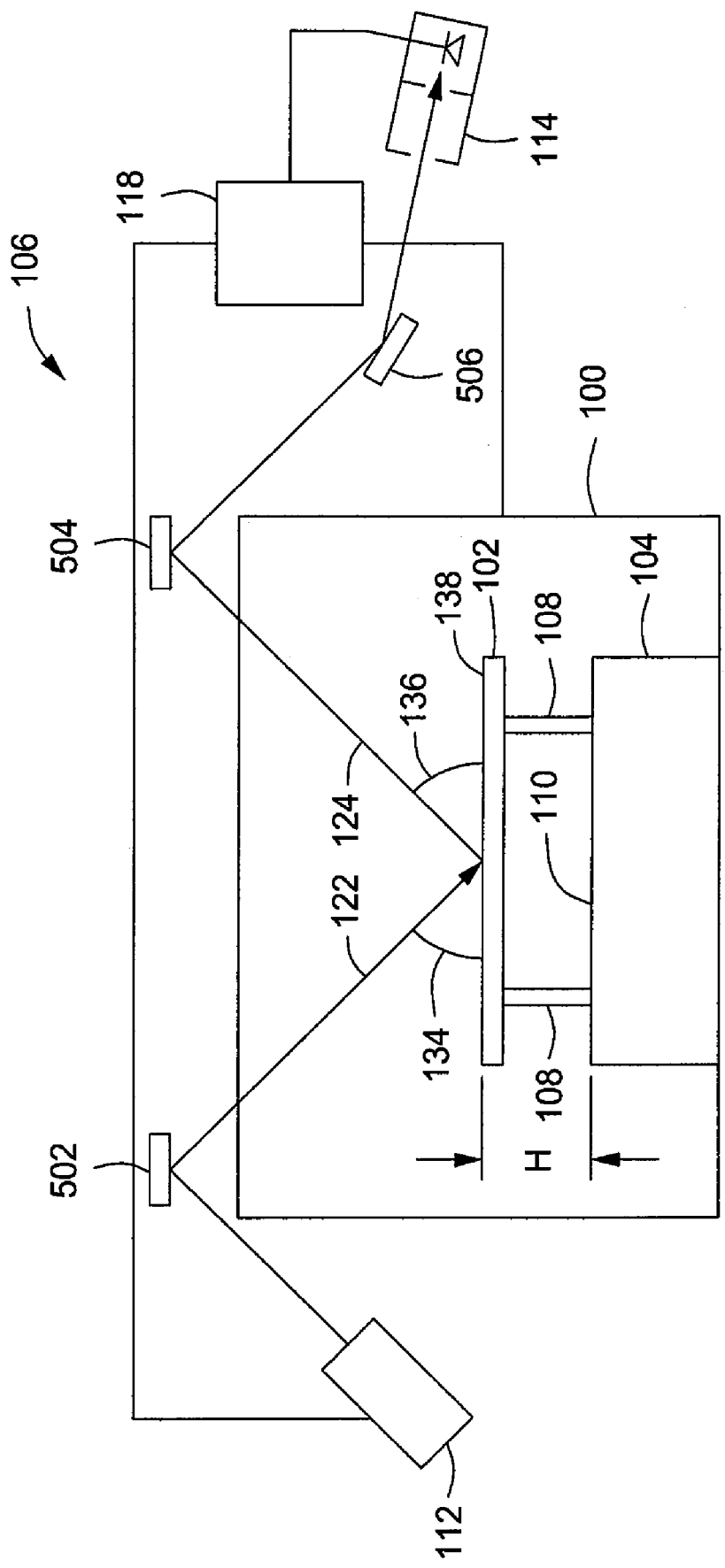
FIG. 5 depicts an exemplary schematic diagram of a process chamber having an apparatus for detecting a substrate position according to some embodiments of the present invention.

In some embodiments, arrangements of optical elements employing other or additional components may be used to detect the substrate position while permitting different dispositions of the light source and light sensor. For example, fiber optics, light pipes, total internal reflection (TIR) components, mirrors, lenses, and the like and combinations thereof may be utilized to direct a beam of light as desired to impinge upon the surface of the substrate and be detected by the light sensor only if the substrate is in a desired position. In one non-limiting example, and as depicted in FIG. 5, the substrate detection system 106 may further comprise one or more optical element (one mirror 502 shown in FIG. 5) that facilitate directing the beam of light 122 from the light source 112 to impinge upon the upper surface 138 of the substrate 102. In addition, one or more optical elements (two mirrors 504, 506 shown in FIG. 5) may be utilized to facilitate directing the reflected beam of light 124 to be detected by the light sensor 114 when the substrate 102 is properly positioned.

Returning to FIG. 1, in operation, the substrate 102 may be held in an elevated position by the lift pins 108 in anticipation of, or immediately subsequent to, a substrate transfer into or out of the process chamber 100. Under normal circumstances, the upper surface 120 of the substrate 102 is expected to be elevated to a predetermined height H with respect to the substrate support 104 and disposed at an predetermined planar orientation (e.g., substantially horizontal). A beam of light 122 produced by the light source 112 is directed towards the upper surface 120 of the substrate 102 at angle 134. If the substrate is properly positioned (e.g., correct height and angle), a reflected beam of light 124, having angle 136 will be directed towards the light sensor 114 and will impinge upon the activating element (e.g., photodiode 116) of the light source 120, thereby generating (or interrupting) a signal routed to the processor 118 indicting that the substrate 102 is properly positioned. Upon determining that the substrate 102 is properly positioned, processing may continue. For example, a substrate transfer robot may enter the process chamber 100 to retrieve the substrate 102, or the lift pins 108 may lower the substrate 102 to the support surface 110 of the substrate support 104 for continued processing of the substrate.

In some embodiments, however, the substrate 102 may not be positioned as desired. In such situations, continued processing may result in damage to the substrate and/or equipment, causing loss of yield, equipment downtime and maintenance costs. Moreover, such damage may lead to contamination of the process chamber with particles that may cause damage to subsequently processed substrates.

Figure 2A:
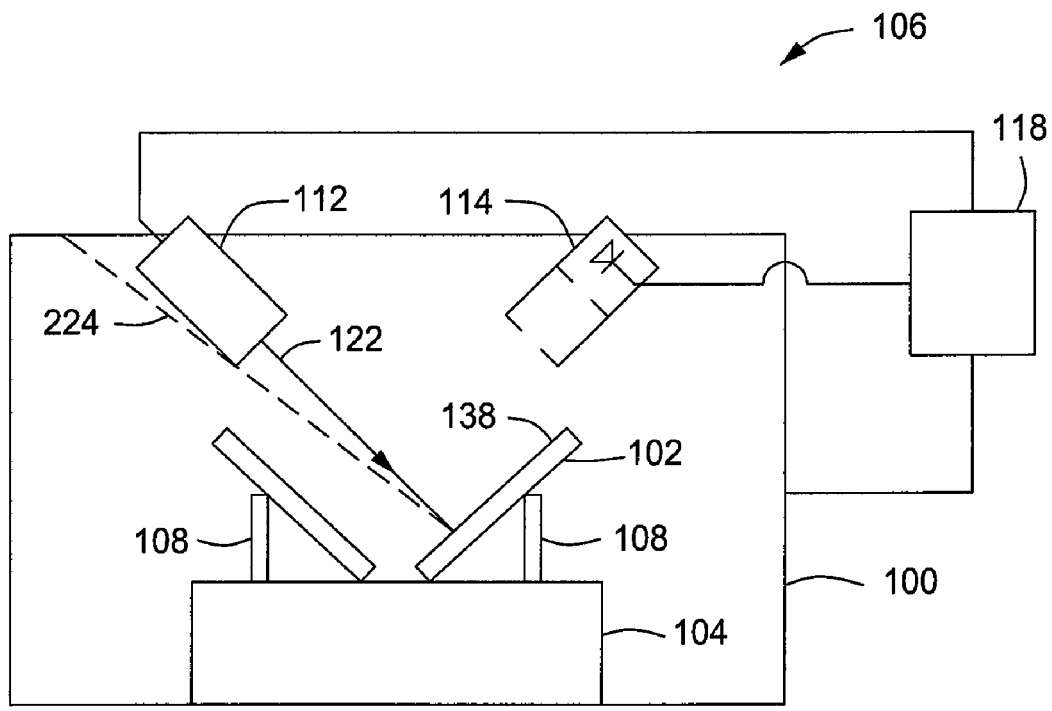
FIGS. 2A-C respectively depict various modes of operation of the substrate position detection apparatus described above with respect to FIG. 1.

For example, as shown in FIG. 2A, the substrate 102 may be partially or completely broken. Such a substrate should not be further processed within the process chamber 100 and attempts to remove the broken substrate 102 from the process chamber 100 via a substrate transfer robot may lead to damage of the robot, damage to the process chamber 100 (or components therein, such as the substrate support), generation of particulate matter that may damage future substrates brought to the process chamber 100, or the like. As shown in FIG. 2A, the beam of light 122 will likely be reflected (as shown in phantom at 228) in a direction that will not be detected by the light sensor 114, thereby causing the processor 118 to generate a fault signal, or otherwise halt processing, as discussed above.

Figure 2B:
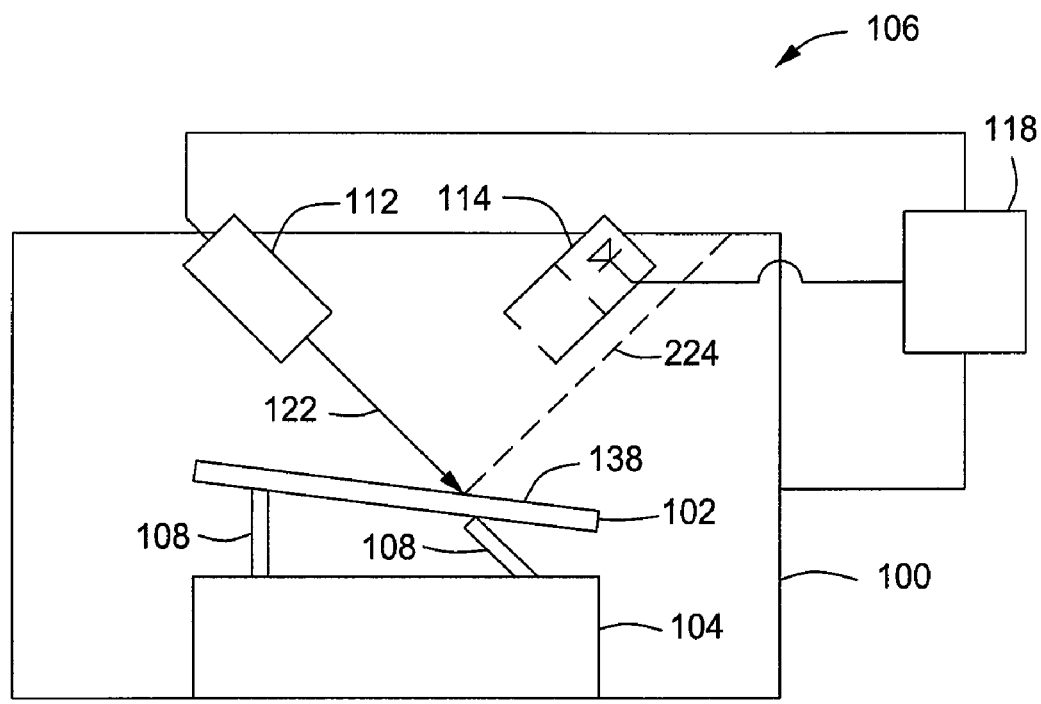

In another example, as shown in FIG. 2B, a broken (or otherwise malfunctioning) lift pin 108 may cause the substrate 102 to be held in a position that is not substantially horizontal or not otherwise satisfactory for either subsequent processing (for example, in process chambers where processes are performed with the substrate elevated above the substrate support) or for automated transfer from the process chamber 100 via a substrate transfer robot. As shown in FIG. 2B, the beam of light 122 will likely be reflected (as shown in phantom at 228) in a direction that will not be detected by the light sensor 114, thereby causing the processor 118 to generate a fault signal, or otherwise halt processing, as discussed above.

Figure 2C:
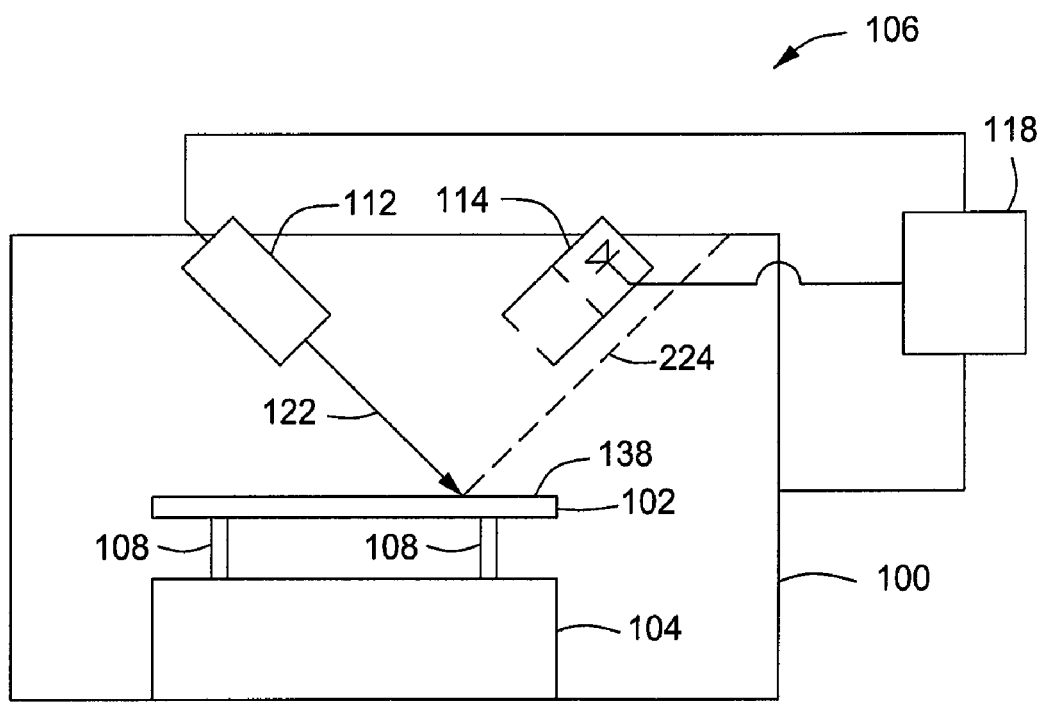

In another example, as shown in FIG. 2C, broken or malfunctioning lift pins, improper recipe inputs, or the like, may cause the substrate 102 to be elevated horizontally, but to an improper height. In such situations, attempts to transfer the substrate 102 may result in a collision between the substrate 102 and the substrate transfer robot (or an otherwise unsuccessful transfer). As shown in FIG. 2C, the beam of light 122 will likely be reflected (as shown in phantom at 228) in a direction that will not be detected by the light sensor 114, thereby causing the processor 118 to generate a fault signal, or otherwise halt processing, as discussed above. It is contemplated that other circumstances may exist to cause the substrate to be misaligned and/or improperly positioned such that the system 106 may detect such misalignment and/or improper positioning.

Figure 3:
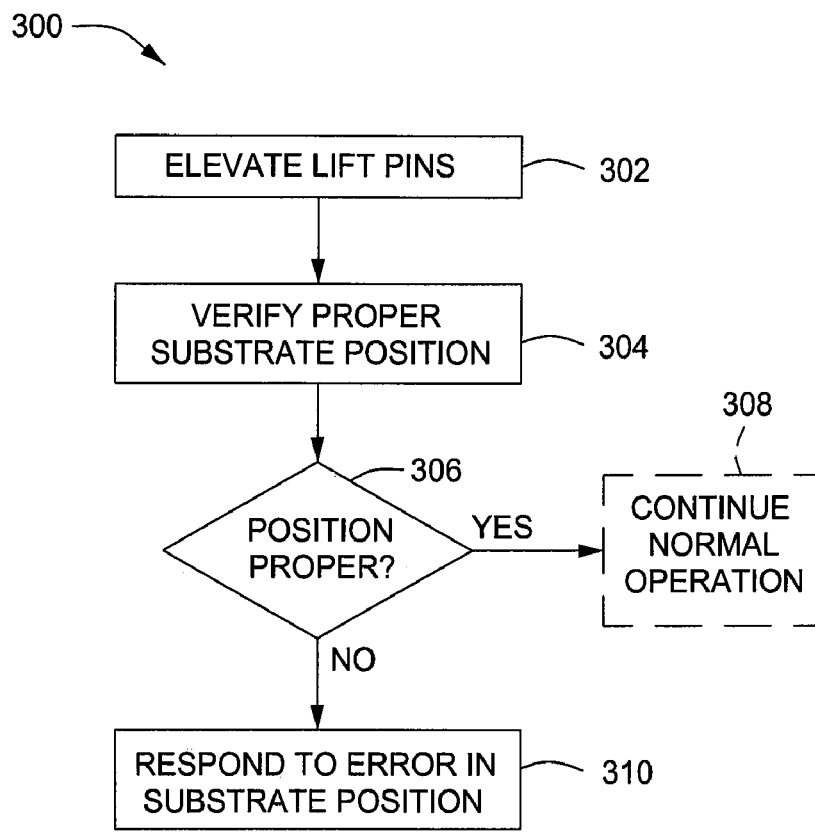
FIG. 3 depicts a flow diagram of a method of processing a substrate according to some embodiments of the present invention.

FIG. 3 is a flow diagram depicting an exemplary embodiment of a method 300 for operating the chamber 100 of FIG.

1 in accordance with one or more aspects of the invention. The method 300 begins at 302, where the lift pins 108 are raised to an elevated position. As discussed above, the substrate 102 may subsequently be disposed upon the lift pins 108 by a substrate transfer robot, or alternatively, a previously present substrate 102 may be lifted off of the substrate support 104 by the elevation of the lift pins 108. In either case, the substrate 102 disposed upon the elevated lift pins 108 is generally expected to be disposed in a predetermined position (e.g., at a predetermined height H above the support surface 110 and substantially parallel thereto, as generally shown in FIG. 1). As discussed above, the lift pins 108 may be controlled by the processor 118 or by a separate controller.

Next at 304, the proper position of the substrate 102 is verified. For example, the system 106 may be operated (e.g., as described above) to verify that the substrate 102 is properly positioned upon the lift pins 108. In some embodiments, the processor 118 may selectively activate the light source 112 as needed to emit light for verifying proper substrate positioning and/or orientation. In some embodiments, the light source 112 may remain active (e.g., continuously and/or continually emitting light) at most or all times during ordinary operation of the chamber 100. In some embodiments, the processor 118 may monitor for a signal from the light sensor 114 indicating that the substrate 102 is properly positioned and/or oriented within the chamber 100, and may be removed from the chamber 100 safely and/or substantially without risk of damage to the substrate 102.

At decision 306, if the proper position of the substrate 102 is verified at 304 (e.g., if the light sensor 114 detects the beam of light 124 reflected off of the upper surface 120 of the substrate 102), the process 300 may proceed to 308 where normal operation may be continued. For example, the substrate 102 may be transferred out of the process chamber 100 via a substrate transfer robot, or processing of the substrate 102 may continue within the process chamber 100. In some embodiments, if the proper position of the substrate 102 is verified, the processor 118 takes no further action, e.g., the processor 118 refrains from taking any action to interrupt, suspend, cancel, or otherwise alter a preplanned retrieval of the substrate 102 from the process chamber 100 in accordance with a predetermined substrate transfer process. In some embodiments, the processor 118 may generate a corresponding signal (e.g., a 'no failure' or 'no fault' signal or the like) and/or transmit such signal to another display and/or processor (not shown, e.g., a system-level monitoring or control processor) or to the attention of an operator, to indicate or confirm that proper substrate position and/or orientation has been verified with respect to the substrate 102.

Alternatively, at decision 306, if the proper position of the substrate 102 is not verified at 304 (e.g., if the light sensor 114 fails to detect the beam of light 124 reflected off of the upper surface 120 of the substrate 102), the process 300 continues to 310, where a response to the error in substrate position may be taken. For example, in some embodiments, the processor 118 can automatically interrupt a preplanned retrieval of the substrate 102 from the process chamber 100. In some embodiments, the processor 118 may further generate a signal (e.g., a 'failure' or 'fault' signal or the like) and/or transmit such a signal to another display and/or processor (e.g., a system-level monitoring or control processor), or to the attention of an operator, to indicate the failure of verification with respect to an expected position and/or orientation of the substrate 102. Accordingly, additional action(s) can be undertaken in response to such 'failure' or 'fault' signal, including but not limited to an operator performing a visual inspection of the chamber to determine the nature of the problem, retrieving a broken or unbroken substrate 102, correcting the elevation of the lift pins 108, performing maintenance and/or cleaning operations in the process chamber 100, or the like.

In some embodiments, in addition to controlling and/or operating the system 106 and/or substrate transfer operations specifically with respect to the chamber 100, the processor 118 can control and/or operate some or all of the chambers and functions of a larger system, such as a cluster tool (not shown) that may include the chamber 100, such as the Centura® platform of cluster tools, available from Applied Materials, inc. of Santa Clara, Calif. Such a cluster tool may, for example, include one or more associated substrate transfer robots for delivering and retrieving substrates with respect to multiple processing, transfer, storage, and/or metrology chambers or pods, any or all of which may be subject to control by the processor 118. In such circumstances, the processor 118 may immediately suspend the operation of a given substrate transfer robot to permit an operator to inspect the chamber 100 as necessary to characterize and/or remediate the problem that gave rise to the failure to verify proper substrate position and/or orientation at 304. Also in such circumstances, one or more of the additional processing, transfer, storage, and/or metrology chambers associated with the cluster tool may be equipped with substrate position detection systems similar to the system 106 described above. A single processor, such as the processor 118, may be coupled to and may control any or all of such components, thereby allowing similar substrate position and/or orientation verification functions to control similar substrate transfer operations with respect to each such chamber.

It is contemplated that other configurations of the system 106 and/or chambers 100, 400 may be utilized to practice the invention described herein. For example, the number and configuration of light sources and/or light sensors may be modified and/or the control of processes upon detection of proper or improper substrate positions may be modified by those skilled in the art by utilizing the teachings disclosed herein without departing from the spirit of the invention.

While the foregoing is directed to embodiments of the present invention, other and further embodiments of the invention may be devised without departing from the basic scope thereof, and the scope thereof is determined by the claims that follow.

The invention claimed is:
1. A substrate position detection apparatus, comprising:
a substrate support having a plurality of lift pins for elevating a substrate over the substrate support;
a light source for directing a beam of light upon a reflective upper surface of the substrate when in an elevated position;
a light sensor for detecting a reflected beam of light from the upper surface of the substrate upon the substrate being aligned in the elevated position; and
a processor to receive signals from the light sensor indicating the substrate is in the elevated position.
2. The apparatus of claim 1, wherein the alignment in the predetermined elevated position includes at least one of horizontal alignment, vertical alignment, and angular alignment.
3. The apparatus of claim 1, wherein the light sensor further comprises a signal generating element that generates a signal upon detecting the reflected light beam of light.
4. The apparatus of claim 1, wherein the processor is configured generate at least one of a fault or a no-fault signal in response to at least one of a receipt of a signal from the light sensor or a failure to receive a signal from the light sensor.

5. The apparatus of claim 1, wherein the processor is configured to halt a substrate transfer operation in response to the lack of detection of the reflected beam of light by the light sensor.

6. The apparatus of claim 1, wherein the processor is coupled to and controls an apparatus for retrieving and transferring a substrate.

7. The apparatus of claim 1, wherein the processor is coupled to and controls a process chamber in which the substrate support is disposed.

8. The apparatus of claim 1, wherein the light sensor further comprises:
a shade defining a first direction along which reflected light from the light beam is permitted to reach and activate the light sensor, and for preventing at least some light passing along directions other than the first direction from reaching the light sensor.

9. The apparatus of claim 8, wherein the first direction coincides with a direction along which the reflected beam of light is caused to pass when the substrate is aligned in the predetermined elevated position.

10. The apparatus of claim 1, wherein the light source is a laser.

11. The apparatus of claim 1, wherein the light source comprises a LED.

12. The apparatus of claim 1, wherein the light sensor further comprises a photodiode.

13. The apparatus of claim 1, further comprising:
at least one of a mirror, a total internal reflection (TIR) element, a fiber optic cable, a light pipe, or a lens optically coupled to at least one of the light source or the light sensor.

14. The apparatus of claim 1, further comprising:
a second light source for directing a second beam of light upon a reflective upper surface of the substrate; and
a second light sensor for detecting a second reflected beam of light from the upper surface of the substrate upon the substrate being aligned in a second predetermined elevated position.

15. A method of processing a substrate, comprising:
elevating a substrate relative to a support with a set of lift pins; and
verifying the proper position of the substrate relative to the support by:
shining a beam of light upon a reflective surface of the substrate; and
monitoring for a reflected beam of light off of the reflective surface indicative of the reflective surface being aligned in a predetermined elevated position.

16. The method of claim 15, wherein elevating the substrate further comprises:
engaging the substrate with the set of lift pins to lift the substrate off of the support using the set of lift pins.

17. The method of claim 15, wherein monitoring for the reflected beam of light further comprises:
monitoring for the reflected beam of light along a predetermined direction indicative of the reflective surface of the substrate being aligned in the predetermined position.

18. The method of claim 15, wherein monitoring for the reflected beam of light further comprises:
monitoring for a failure to receive a signal indicative of the reflective surface of the substrate being aligned in the predetermined position.

19. The method of claim 15, wherein monitoring for the reflected beam of light further comprises:
aligning a light sensor to receive the reflected beam of light only upon the reflective surface of the substrate being aligned in the predetermined position.

20. The method of claim 15, further comprising:
halting a retrieval of the substrate from the support in response to a failure to verify the proper position of the substrate relative to the support.

21. The method of claim 15, further comprising:
removing the substrate from the support in response to verification of the proper position of the substrate relative to the support.

* * * * *